(12) United States Patent
Slavov et al.

(10) Patent No.: US 8,125,074 B2
(45) Date of Patent: Feb. 28, 2012

(54) LAMINATED SUBSTRATE FOR AN INTEGRATED CIRCUIT BGA PACKAGE AND PRINTED CIRCUIT BOARDS

(75) Inventors: Nedyalko Slavov, Zurich (CH); Heinz-Peter Wirtz, Dottingen (CH); Kwei-Kuan Kuo, Zurich (CH)

(73) Assignee: ST-Ericsson SA, Geneva (CH)

( * ) Notice: Subject to any disclaimer, the term of this patent is extended or adjusted under 35 U.S.C. 154(b) by 144 days.

(21) Appl. No.: 12/558,417

(22) Filed: Sep. 11, 2009

(65) Prior Publication Data

US 2011/0061917 A1    Mar. 17, 2011

(51) Int. Cl.
*H01L 23/053* (2006.01)
*H01L 23/12* (2006.01)

(52) U.S. Cl. .. 257/701; 257/700; 257/774; 257/E23.173

(58) Field of Classification Search ............... 257/700, 257/701, E23.173
See application file for complete search history.

(56) References Cited

U.S. PATENT DOCUMENTS

| | | | | |
|---|---|---|---|---|
| 5,375,042 A * | 12/1994 | Arima et al. | ................... | 361/784 |
| 5,486,542 A * | 1/1996 | Posthuma et al. | ............. | 518/700 |
| 5,672,911 A * | 9/1997 | Patil et al. | ...................... | 257/691 |
| 7,352,060 B2 * | 4/2008 | Shimizu et al. | ............... | 257/700 |
| 7,816,782 B2 * | 10/2010 | Murai et al. | ................... | 257/702 |
| 2002/0149102 A1 * | 10/2002 | Hashemi et al. | .............. | 257/706 |

* cited by examiner

*Primary Examiner* — Nitin Parekh
(74) *Attorney, Agent, or Firm* — Potomac Patent Group PLLC

(57) ABSTRACT

A laminated substrate for an integrated circuit package, including a core layer and at least one build-up layer located above only one side of said core layer. An integrated circuit package, including a laminated substrate and including an integrated circuit die placed above the side build-up layer.

13 Claims, 4 Drawing Sheets

LAMINATED SUBSTRATE FOR AN INTEGRATED CIRCUIT BGA PACKAGE AND PRINTED CIRCUIT BOARDS

BACKGROUND

1. Technical Field

The present invention relates to the field of laminated substrates for integrated circuit packages.

2. Description of the Related Art

Currently, laminated substrates comprise multilayer symmetrical structures having thin build-up layers of equal thicknesses, integrating a connection network.

BRIEF SUMMARY

It is proposed a laminated substrate for an integrated circuit package.

The laminated substrate can include a core layer and at least one build-up layer located above only one side of said core layer.

The laminated substrate can include an electrical connection network comprising an electrical connection pattern on the external face of the core layer for an electrical connection of the network externally to the substrate.

The laminated substrate can include an electrical connection network connecting connection patterns of the sides of the substrate through the core layer and the at least one build-up layer.

The laminated substrate can include an electrical connection network comprising an external connection pattern formed on an external side of a build-up layer, at least one intermediate connection pattern formed between the core layer and the at least one build-up layer, vias through the at least one build-up layer and vias through drilled holes of the core layer.

The core layer can include a main layer and at least one sub-layer joined side by side.

The core layer can include at least one compensating layer integrated between the main layer and the sub-layer.

It is proposed an integrated circuit package, including a laminated substrate and including an integrated circuit die placed above the unique side build-up layer.

It is proposed an integrated circuit package, including a laminated substrate comprising a core layer, at least one build-up layer located above only one side of said core layer and an electrical connection network and including an integrated circuit die placed above a side build-up layer and connected to the connection network.

It is proposed a method for fabricating a laminated substrate for an integrated circuit package, comprising taking a thick core layer and forming at least one build-up layer above only one side of said core layer It is proposed a method for fabricating a laminated substrate for an integrated circuit package, comprising taking a thick core layer, forming connection means on the sides of the core layer, drilling mechanically holes through the core layer and realizing connection means for connecting said connection patterns through the holes, and forming at least one build-up layer above only one side of said core layer and realizing connection means on and through the at least one build-up layer.

BRIEF DESCRIPTION OF THE SEVERAL VIEWS OF THE DRAWINGS

Other advantages and features will become apparent by studying integrated circuit device or package, described by way of non-limited examples and illustrated by the appended drawings in which.

DETAILED DESCRIPTION

Figure 1:
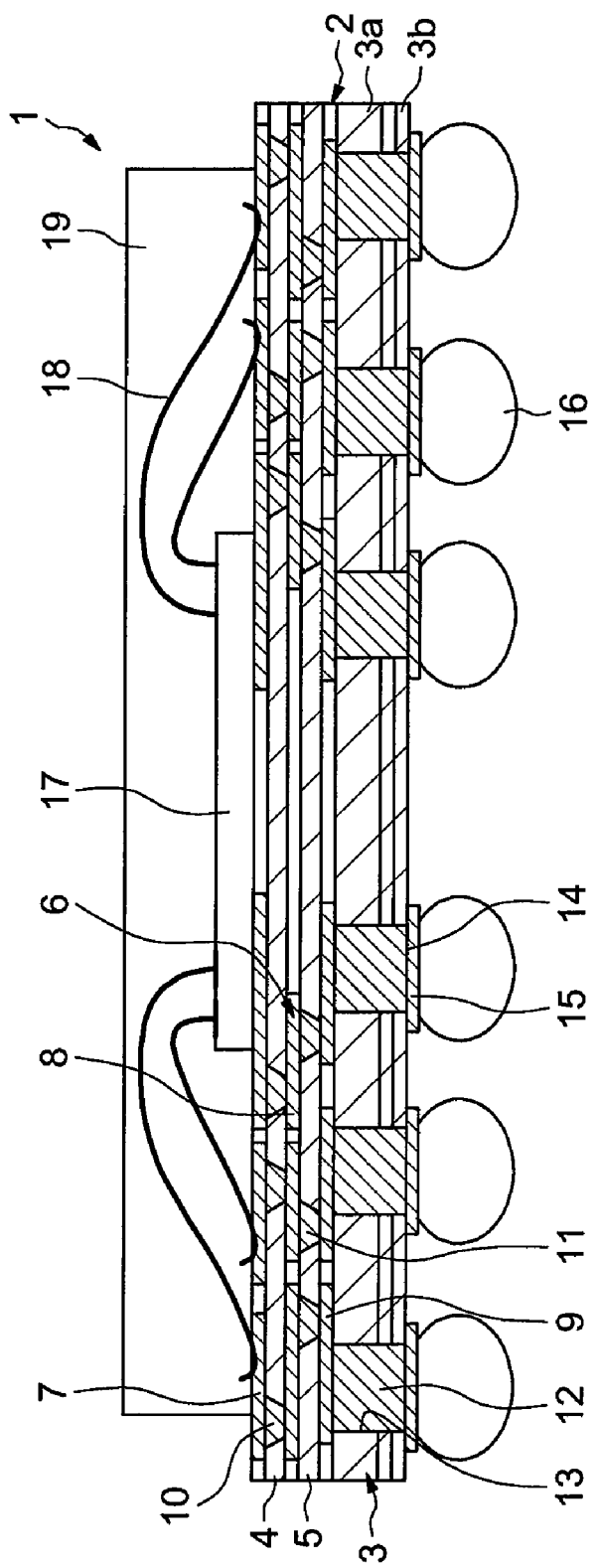
FIG. 1 represents a cross section of an integrated circuit device or package.

Referring to FIG. 1, an integrated circuit package 1 is represented.

The integrated circuit package 1 includes a laminated substrate 2 which comprises a dielectric core layer 3 and comprises, only above one side of the core layer 3, a side dielectric build-up layer 4 and eventually at least an intermediate dielectric build-up layer 5 located between the core layer 3 and the side build-up layer 4.

It means that the other side of the core layer 3 is free from any build-up layer.

The laminated substrate 2 includes a metal electrical connection network 6.

The connection network 6 includes an external connection pattern 7 formed on the external side of the side build-up layer 4, an intermediate connection pattern 8 formed between the unique side build-up layer 4 and the intermediate build-up layer 5, an intermediate connection pattern 9 formed between the intermediate build-up layer 5 and the core layer 3.

The connection network 6 includes also vias 10 realized through the side build-up layer 4 for connecting the external connection pattern 7 to the intermediate connection pattern 8, vias 11 realized through the intermediate build-up layer 5 for connecting the intermediate connection patterns 8 and 9, and vias 12 realized through drilled hole 13 of the core layer 3 connected to the intermediate connection pattern 9, the external faces of the vias 12 forming an electrical connection pattern 14 of the external face of the core layer 3 for an electrical connection of the network 6 externally to the substrate 2.

The electrical connection pattern 14 can further comprise pads 15 formed on the external face of the core layer 3, adapted for receiving external connection balls 16.

The integrated circuit package 1 can include an integrated circuit die 17 which is linked to the external side of the side build-up layer 4, for example by means of a layer of glue.

The integrated circuit die 17 can be electrically connected to the external connection pattern 7 of the laminated substrate 2 by means of connection bond wires 18.

The integrated circuit package 1 can include also an encapsulating block 19 which encapsulates the die 17 and the connection wires 18 above the external face of the side build-up layer 4, for example by molding.

Figure 7:
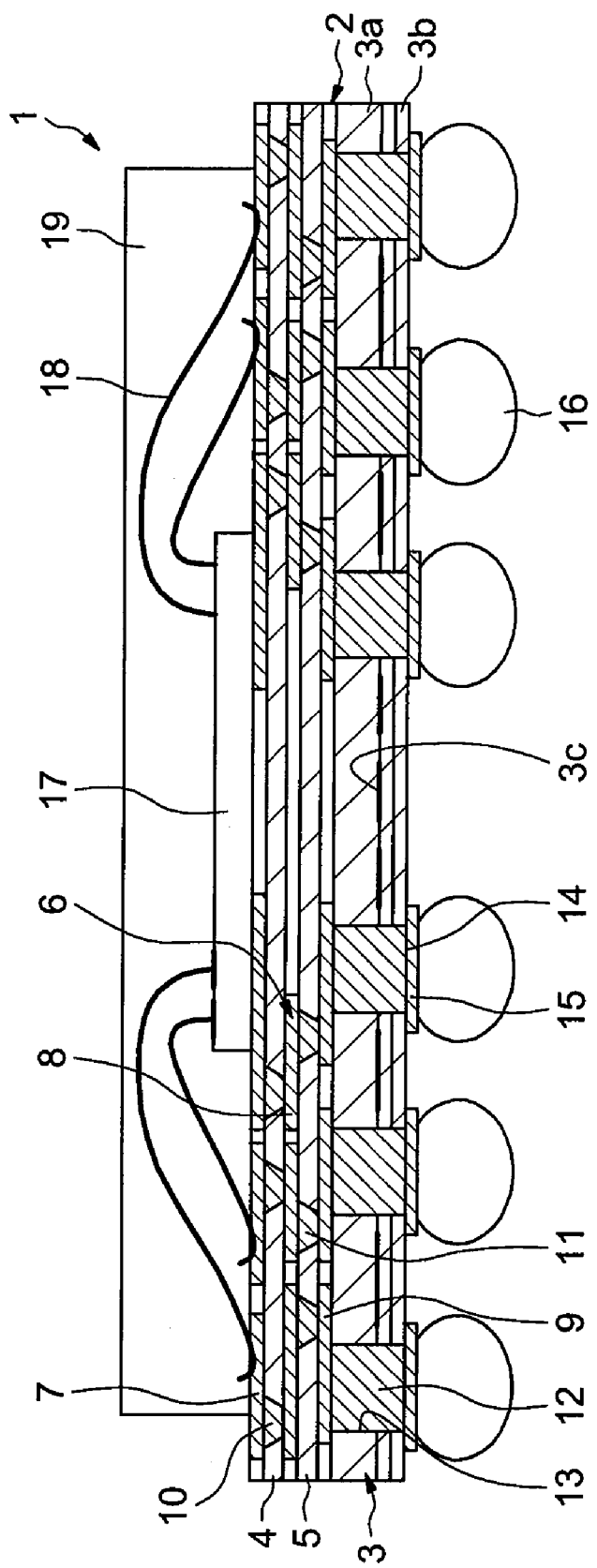
FIG. 7 represents a cross section of a variant of the laminated substrate of FIG. 1, with a compensating layer.
Figure 8:
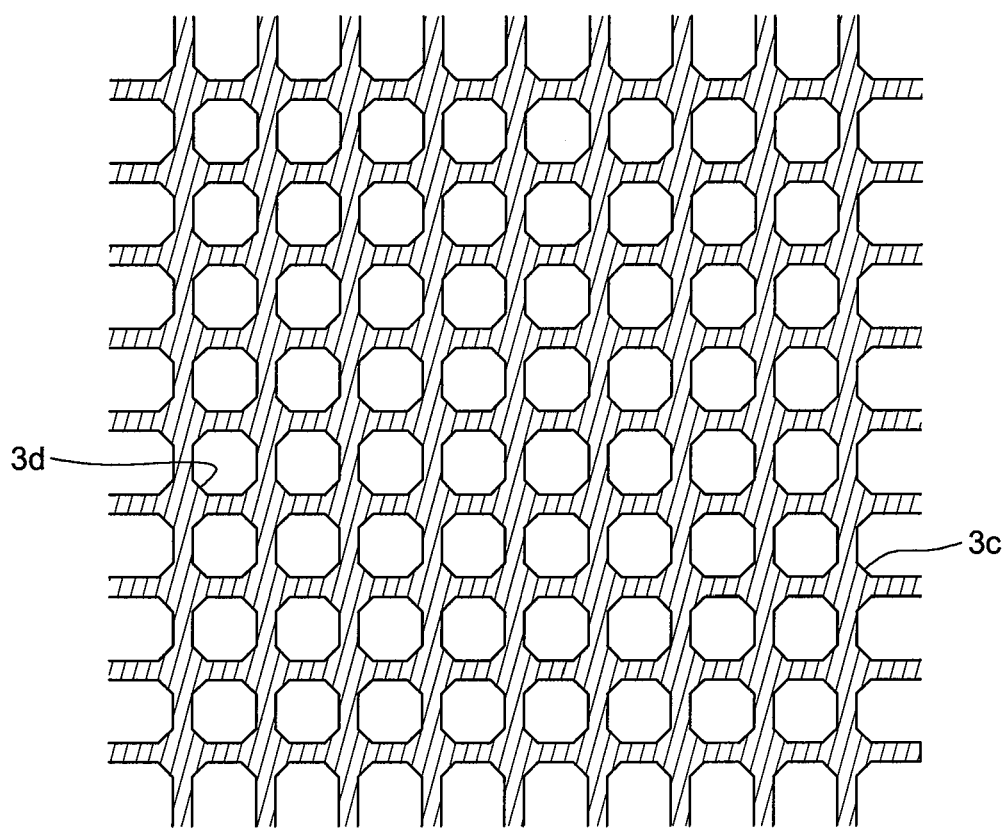
FIG. 8 represents a front view of a compensating layer.

The core layer 3 can be of a one-piece. But, the core layer 3 can comprises a main layer 3a and at least one sub-layer 3b joined side by side, the at least one sub-layer 3b being opposite to the build-up layers 4 and 5. Furthermore, as illustrated on FIGS. 7 and 8, the core layer 3 can includes at least one compensating layer 3c integrated between the main layer 3a and the at least one sub-layer 3b and or integrated between sub-layers 3b. The compensating layer 3c can be formed as a dummy metal pattern having gaps 3d through which the drilled holes 13 are done at a distance for having no contact between the metal pattern and the vias 12.

The at least one sub-layer 3b and/or the at least one compensating layer 3c can be chosen in such way that they match the mechanical and the thermal properties of the upper-sided build-up layers 4 and 5 in order to avoid a possible warp of the laminated substrate 2 during a thermal stress.

Other features and advantageous of the laminated substrate 2 and the complete integrated circuit package 1 will be now indicated.

The proposed structures are able to achieve a performed combination of mechanical resistances, electrical connections and adapted methods of fabrication.

Comparatively, the thickness of the core layer 3 is sufficiently higher than the thickness of the build-up layer 4 and 5 such that the laminated substrate 2 is asymmetrical, the core layer 3 being thick and the build-up layers 4 and 5 being thin.

So, the core layer can ensure a great part of the mechanical resistance and the strength of the substrate and consequently the mechanical resistance and the strength of the package.

The mechanical and thermal properties of the core layer can be chosen in such a way that they compensate these properties of the build-up layers.

Specific methods of fabrication can be used on one hand for the core layer and on the other hand for the build-up layers.

The build-up layers are able to result of advanced methods of fabrication for achieving dense interconnections, as laser drills, dry films and etching of high precision for having fine pattern formation. So, the build-up layers can be used for very high routings and most of the routings.

The core layer can ensure direct connections towards and from external components, which necessitate generally limited amount of signals and does not need very high routing resolution. So, classic methods of fabrication can be used, as mechanical drills, chemical deposition and etching.

For example, the laminated substrate 2 can be fabricated as following.

Figure 2:
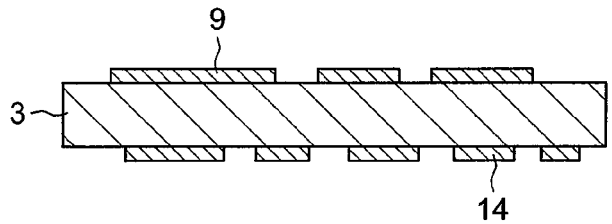
FIG. 2 represents a cross section of an intermediate step of fabrication of a laminated substrate of FIG. 1.

Having a core layer plate 3, metal layers are laminated on the sides of the core layer 3 and are etching to form desired metal connection pattern means corresponding substantially to the connection patterns 9 and 14 (FIG. 2).

Figure 3:
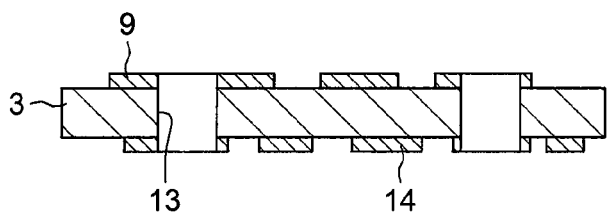
FIG. 3 represents a cross section of another intermediate step of fabrication of a laminated substrate of FIG. 1.

After that, the core layer plate 3 is drilled mechanically for obtaining holes 13 (FIG. 3).

Figure 4:
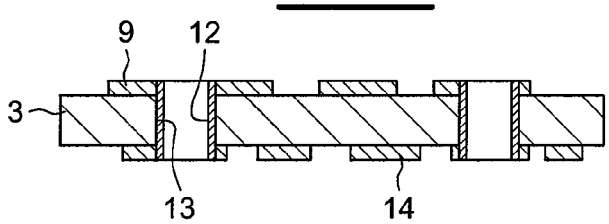
FIG. 4 represents a cross section of another intermediate step of fabrication of a laminated substrate of FIG. 1.

After that, metal plating is realized for obtaining vias 12 through the holes 13, which connect the connection patterns 9 and 14 (FIG. 4).

Figure 5:
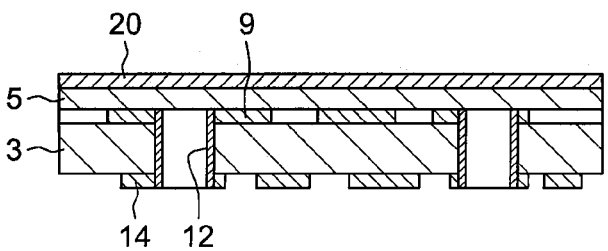
FIG. 5 represents a cross section of an intermediate step of fabrication of a laminated substrate of FIG. 1.

After having filled the holes 13 with epoxy material, a build-up layer 5 and a metal layer 20 are laminated only on the side of the core layer 3 having the connection patterns 9 (FIG. 5).

Figure 6:
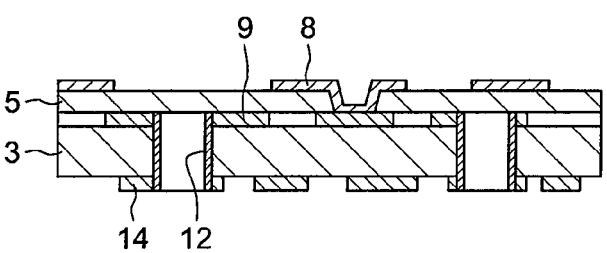
FIG. 6 represents a cross section of another intermediate step of fabrication of a laminated substrate of FIG. 1.

After that, by means of laser drilling and etching method, an intermediate connection pattern 8 and vias 11 are realized in the metal layer 20 and through the build-up layer 5 for being connected to the connection pattern 9 (FIG. 6).

The above steps (FIGS. 5 and 6) can be repeated for forming the side built-up layer 4, the side connection pattern 7 and the vias 10. An additional step can be operated for forming the external connection pads 15.

Although embodiments of the devices and systems of the present disclosure have been illustrated in the accompanying drawings and described in the foregoing detailed description, it will be understood that the invention is not limited to the embodiments disclosed, but is capable of numerous rearrangements, modifications and substitutions without departing from the spirit of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A laminated substrate for an integrated circuit package, comprising:
    a core layer having drilled holes therethrough; and
    a build-up layer, thinner than the core layer, located above only one side of said core layer, wherein the core layer includes a main layer, a sub-layer on an opposite side of the main layer with respect to the build-up layer, and a metal compensating layer integrated between the main layer and the sub-layer, the metal compensating layer having a metal pattern with gaps through which the drilled holes extend, respectively.

2. A laminated substrate according to claim 1, including an electrical connection network comprising an electrical connection pattern on an external face of the core layer for an electrical connection of the connection network externally to the substrate.

3. A laminated substrate according to claim 1, including:
    a first connection pad on the build-up layer;
    a second connection pad on an opposite side of the sub-layer with respect to the main layer; and
    an electrical connection network connecting the first and second connection pads to each other through the core layer and the build-up layer, the electrical connection network including a conductive via that extends through one of the drilled holes and a corresponding one of the gaps, the conductive via being spaced apart from the metal pattern.

4. A laminated substrate according to claim 1, including an electrical connection network that includes:
    an external connection pattern formed on an external side of the build-up layer,
    an intermediate connection pattern formed between the core layer and the build-up layer,
    first connection vias through the build-up layer, and
    second connection vias through drilled holes of the core layer and through corresponding gaps of the gaps of the metal compensating layer, the second connection vias being spaced apart from the metal pattern.

5. A laminated substrate according to claim 1, in which the metal compensating layer and/or the sub-layer is/are configured to match mechanical and thermal properties of the build-up layer in order to avoid a possible warp of the laminated substrate during a thermal stress.

6. An integrated circuit package, comprising:
    an integrated circuit die; and
    a laminated substrate that includes a core layer and a build-up layer, thinner than the core layer, located above only one side of said core layer, the integrated circuit die being placed above the build-up layer, wherein:
    the core layer has drilled holes therethrough; and
    the core layer includes a main layer, a sub-layer on an opposite side of the main layer with respect to the build-up layer, and a conductive compensating layer integrated between the main layer and the sub-layer, the conductive compensating layer having a conductive pattern with gaps through which the drilled holes extend, respectively.

7. An integrated circuit package according to claim 6, further comprising an electrical connection network coupled to the integrated circuit die.

8. An integrated circuit package according to claim 6, including an electrical connection network that includes:
- a first external connection pattern formed on an external side of the build-up layer, the first external connection pattern being electrically coupled to the integrated circuit die;
- an intermediate connection pattern formed between the core layer and the build-up layer;
- first connection vias through the build-up layer, the first connection vias being electrically coupled to the first external connection pattern and the intermediate connection pattern;
- a second external connection pattern formed on an external side of the core layer; and
- second connection vias extending through the drilled holes of the core layer and the gaps in the conductive compensating layer, the second connection vias being electrically coupled to the second external connection pattern and the intermediate connection pattern and being spaced apart from conductive pattern.

9. An integrated circuit package according to claim 8, wherein the conductive compensating layer and/or the sub-layer is/are configured to match mechanical and thermal properties of the build-up layer in order to avoid a possible warp of the laminated substrate during a thermal stress.

10. A laminated substrate for an integrated circuit package, the laminated substrate comprising:
- a core layer having first and second surfaces and a plurality of holes extending completely through the core layer, the first surface being a first external surface of the laminated substrate, the core layer including a main layer, a sub-layer on an opposite side of the main layer with respect to the build-up layer, and a conductive compensating layer integrated between the main layer and the sub-layer, the conductive compensating layer having a conductive pattern with gaps through which the holes extend, respectively;
- first and second conductive patterns formed directly on the first and second surfaces, respectively, of the core layer;
- first conductive connectors positioned in the holes of the core layer and electrically connecting the first and second conductive patterns to each other;
- a first build-up layer positioned on the second conductive pattern and having a plurality of holes extending completely through the first build-up layer, the first build-up layer being thinner than the core layer and having a surface that is a second external surface of the laminated substrate;
- a third conductive pattern on the surface of the first build-up layer; and
- second conductive connectors extending in the holes of the build-up layer and electrically connecting the second and third patterns to each other.

11. A laminated substrate according to claim 10, wherein the compensating layer and/or the sub-layer is/are configured to match mechanical and thermal properties of the build-up layer in order to avoid a possible warp of the laminated substrate during a thermal stress.

12. A laminated substrate according to claim 10, wherein the first conductive connects extend through the gaps, respectively, and are spaced apart from the conductive pattern.

13. A laminated substrate according to claim 10, further comprising a second build-up layer positioned between the core layer and the first build-up layer, the second build-up layer being thinner than the core layer and having a plurality of holes extending completely through the second build-up layer, wherein the second conductive connectors include:
- first conductive vias extending completely through the holes in the first build-up layer;
- second conductive vias extending completely through the holes in the second build-up layer; and
- a fourth conductive pattern positioned between the first and second build-up layers and electrically connecting the first and second conductive vias to each other.

\* \* \* \* \*